(12) United States Patent
Lee

(10) Patent No.: US 11,802,906 B2
(45) Date of Patent: Oct. 31, 2023

(54) ELECTRONIC COMPONENT TEST HANDLER HAVING HAND TEACHING FUNCTION AND HAND TEACHING METHOD USING SAME

(71) Applicant: ATECO INC., Gunpo (KR)

(72) Inventor: Taek Seon Lee, Hwaseong (KR)

(73) Assignee: ATECO INC., Gunpo (KR)

( * ) Notice: Subject to any disclaimer, the term of this patent is extended or adjusted under 35 U.S.C. 154(b) by 125 days.

(21) Appl. No.: 17/438,876

(22) PCT Filed: Apr. 8, 2020

(86) PCT No.: PCT/KR2020/004732
§ 371 (c)(1),
(2) Date: Sep. 13, 2021

(87) PCT Pub. No.: WO2020/213879
PCT Pub. Date: Oct. 22, 2020

(65) Prior Publication Data
US 2022/0155363 A1 May 19, 2022

(30) Foreign Application Priority Data
Apr. 15, 2019 (KR) .......................... 10-2019-0043944

(51) Int. Cl.
*G01R 31/28* (2006.01)
*G01R 1/02* (2006.01)
(Continued)

(52) U.S. Cl.
CPC ..... *G01R 31/2867* (2013.01); *G01R 31/2893* (2013.01); *G01B 11/0608* (2013.01)

(58) Field of Classification Search
CPC .... G01R 31/02; G01R 31/28; G01R 31/2867; G01R 31/2887; G01R 31/2891;
(Continued)

(56) References Cited

U.S. PATENT DOCUMENTS

2018/0267097 A1* 9/2018 Matsumoto .......... G01R 1/0433

FOREIGN PATENT DOCUMENTS

| JP | 2005183760 A | 7/2005 |
|---|---|---|
| KR | 20030049834 A | 6/2003 |

(Continued)

*Primary Examiner* — Neel D Shah

(57) ABSTRACT

The present invention relates to a test handler having a hand teaching function and a hand teaching method using same, the test handler comprising: a plurality of sites where devices are picked up or placed; reference points disposed adjacent to the plurality of sites, respectively; and a hand configured to transfer a device and including a sensor unit configured to calculate the position of a reference point in a non-contact manner. By the electronic component test handler having a hand teaching function and the hand teaching method using same, according to the present invention, an error which may occur due to repeated use or a position error required to be corrected according to exchange of kits can be automatically corrected using a reference groove, so that a separate work for position correction is not required and thus convenience and efficiency can be improved.

10 Claims, 11 Drawing Sheets

(51) Int. Cl.
*G01R 1/067* (2006.01)
*G01R 1/04* (2006.01)
*G01R 1/073* (2006.01)
*G01B 11/06* (2006.01)

(58) Field of Classification Search
CPC ........ G01R 31/2893; G01R 1/02; G01R 1/04; G01R 1/067; G01R 1/073
See application file for complete search history.

(56) References Cited

FOREIGN PATENT DOCUMENTS

| | | |
|---|---|---|
| KR | 20080008661 A | 1/2008 |
| KR | 101428925 | 9/2014 |
| KR | 20160093034 | 8/2016 |
| KR | 101734397 | 5/2017 |
| KR | 20180041048 | 4/2018 |

* cited by examiner

ELECTRONIC COMPONENT TEST HANDLER HAVING HAND TEACHING FUNCTION AND HAND TEACHING METHOD USING SAME

CROSS-REFERENCE TO RELATED APPLICATION

This application is a national stage application, filed under 35 U.S.C. § 371, of International Patent Application No. PCT/KR2020/004732, filed on Apr. 8, 2020, which claims the priority of Korean application No. 10-2019-0043944, filed Apr. 15, 2019, which is incorporated by reference herein in its entirety.

TECHNICAL FIELD

The disclosure relates to an electronic device test handler having a hand teaching function and a hand teaching method using the same.

BACKGROUND ART

An electronic device test handler refers to an apparatus for testing a plurality of electronic devices, for example, semiconductor devices or modules, and solid-state drives (SSD) after they are manufactured. The electronic device test handler is provided to connect the electronic devices to a test apparatus, test whether the electronic devices normally operate under various artificial environments, and sort out the electronic devices by distinguishing among passed components, components to be retested, defective components, etc. according to test results.

The electronic device test handler carries out material transport by exchanging a user tray, which is loaded with devices to be tested or with tested devices, with the outside, and the material transport to the outside should be performed in an appropriate cycle so as to continue testing.

Regarding such a test handler, there has been disclosed Korean Patent No. 1,734,397 (registered on May 2, 2017) applied by the present applicant.

However, such a conventional test handler has a problem that errors are accumulated while the hands are activated, or a problem of inefficiency that a pick-up position needs to be manually corrected or position adjustment is needed when a kit is replaced.

DISCLOSURE

Technical Problem

An aspect of the disclosure is to provide an electronic device test handler having a hand teaching function and a hand teaching method using the same to solve the foregoing onerous problems of the conventional electronic device test handler in which or pick-up and placing positions need to be manually corrected by reflecting accumulation of a hand's position errors due to repetitive use or position difference due to replacement of a kit of the hand.

Technical Solution

To achieve the aspect of the disclosure, there is provided a test handler with a hand teaching function, the test handler including: a plurality of sites in which a device is picked up or placed; a reference point provided adjacent to each of the plurality of sites; and a hand provided to transfer the device and including a contactless sensor to calculate a position of the reference point.

Here, the reference point may include coordinates within a reference groove formed to have a predetermined depth and a predetermined inner diameter on a base.

Meanwhile, the test handler with the hand teaching function may further include a controller to control the hand to calculate a center of the reference groove as the reference point based on a reference-position resetting input.

Further, the sensor may include a laser displacement sensor to measure a height of a top surface of the base.

Meanwhile, the controller may extract a pair of boundary coordinates by straightly moving the sensor to above the reference groove when the reference point is calculated, and calculate intermediate coordinates based on the pair of boundary coordinates.

Further, the controller may control: the calculation for extracting the intermediate coordinates to be performed in a first direction and a second direction orthogonal to the first direction, and straight movement to be performed in a direction passing the intermediate coordinates in the first direction when the intermediate coordinates in the second direction are calculated.

Further, the controller resets the intermediate coordinates in the second direction as the reference point.

In addition, there is provided a hand teaching method of a test handler, including: receiving a signal for resetting a reference point when a hand of the test handler is activated; moving the hand to above one among reference grooves adjacent to a site where the hand is picked up and placed; calculating a position of the reference point by a contactless sensor provided in the hand; and resetting a position of the site based on the position of the reference point.

Meanwhile, the calculating the position of the reference point may include calculating the position of the reference groove formed with a predetermined depth and a predetermined diameter on a base.

Further, the calculating the position of the reference point may include calculating a position of a center of the reference groove.

Meanwhile, the sensor may include a laser displacement sensor to distinguish between the base of the test handler and the reference groove based on a height difference.

Further, the calculating the position of the reference groove may include: controlling a position of the hand so that the laser displacement sensor can cross the reference groove in a certain direction above the reference groove; and extracting boundary coordinates of a pair of reference grooves by the laser displacement sensor, and calculating intermediate coordinates based on the boundary coordinates of the pair of reference grooves.

Further, the calculating the position of the reference groove may include calculating the intermediate coordinates, the calculating the intermediate coordinates including: calculating first-directional intermediate coordinates while the laser displacement sensor crosses the reference groove in a first direction; and calculating second-directional intermediate coordinates while the laser displacement sensor moves in a second direction orthogonal to the first direction and passing the first-directional intermediate coordinates.

Meanwhile, the second-directional intermediate coordinates may be reset based on the position of the center of the reference groove.

Advantageous Effects

An electronic device test handler having a hand teaching function and a hand teaching method using the same have effects on improving convenience and efficiency because the position error caused by an error due to repetitive use or replacement of the kit is automatically corrected based on the reference groove and thus there are no needs of separate work for the position correction.

MODE FOR CARRYING OUT DISCLOSURE

Figure 1:
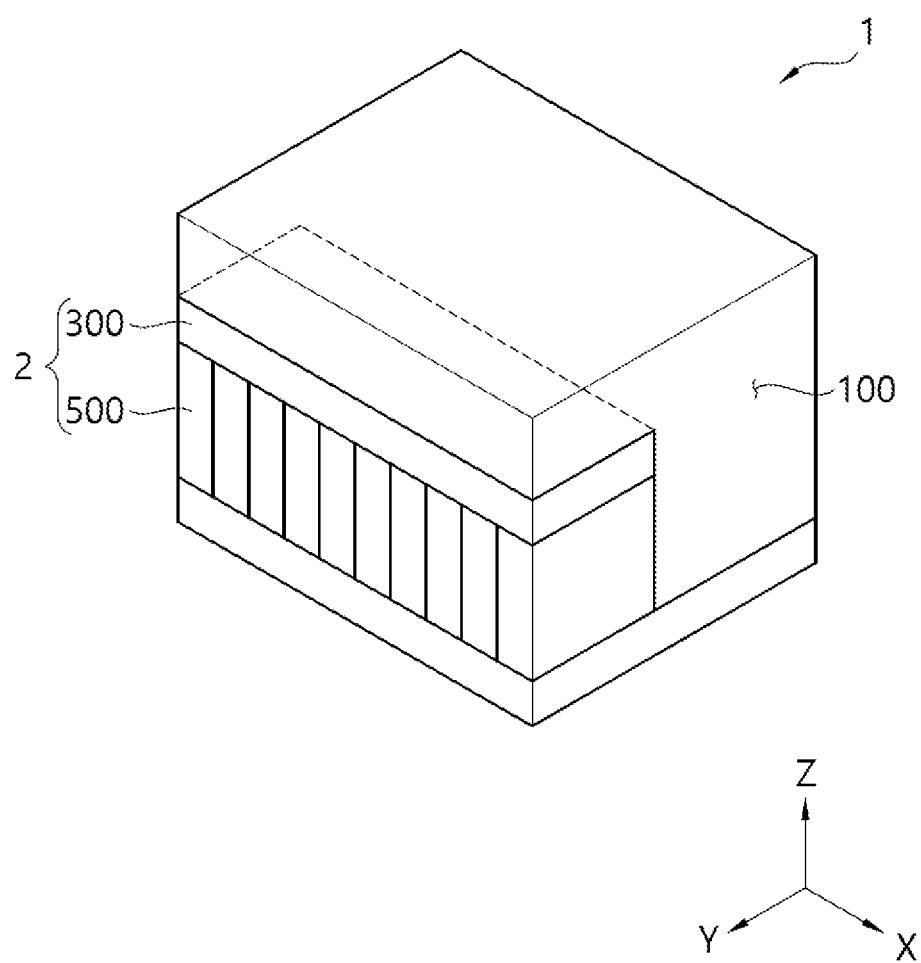
FIG. 1 is a perspective view of a test handler according to the disclosure.

Below, a stacker of an electronic device test handler and an electronic device test handler including the same according to an embodiment of the disclosure will be described in detail with reference to the accompanying drawings. Elements described in the following embodiments may be called other names in relevant fields. However, if the elements are similar or identical in terms of their functions, they may be regarded as equivalents even in alternative embodiments. Further, signs assigned to the elements are given for convenience of description. However, content on the drawings with these given signs do not limit the elements to a range in the drawings. Likewise, even though the elements on the drawings are partially modified according to alternative embodiments, they having functional similarity and identity may be regarded as equivalents. Further, if those skilled in the art recognizes natural involvement of elements, descriptions of the elements will be omitted.

The following description will be made on the premise that a device refers to an electrically functional element such as a semiconductor device, a semiconductor module, a solid-state drive, etc. Further, the following description will be made on the premise that a user tray refers to a tray including a plurality of loading grooves regularly arranged to be loaded with semiconductor devices, and the loading groove does not have any separate holding function so that the device can be held in the groove by its own weight.

Below, an overall structure of the test handler according to the disclosure will be described with reference to FIGS. 1 to 3.

FIG. 1 is a perspective view of a test handler according to the disclosure

As shown in FIG. 1, a test handler 1 according to the disclosure is structured to bring a device 20 from the outside, perform a test, and selectively take the device 20 out according to grades.

According to functions, the test handler 1 may be spatially divided into a region, i.e., a stacker for bringing a plurality of user trays 10 from the outside or taking the user trays 10 to the outside, and a region, i.e., a test handler main body 100 for transferring the device 20 from the user tray 10, performing the test, sorting out the device 20 according to the grades, and loading the device 20 into the user tray 10.

The stacker 2 refers to a region to be loaded with the user tray 10 in quantity. The stacker may include a loading stacker, an unloading stacker and an empty stacker according to the loaded device 20.

The loading stacker is provided to load therein the user tray 10 loaded with the devices 20 needed to be tested and sorted out. The loading stacker is provided to have a size for loading therein the plurality of user trays 10 brought from the outside and loaded in units of '1 lot'. The unloading stacker is provided to load therein a plurality of user trays 10, which are loaded with the devices 20 to be taken out among the tested and sorted devices 20, in units of '1 lot' before taking the devices 20 out. The empty stacker is structured to load there in a plurality of empty user trays 10, and provided to receive the empty user trays 10 after the transfer of the devices 20 from the loading stacker is completed, or transfer the empty user tray 10 to the unloading stacker.

Meanwhile, the loading stacker, the unloading stacker, and the empty stacker may be classified according to material transport to the outside, material transport inside the test handler 1, and loading purposes, but their own structures may be the same or similar.

Each stacker module 500 may be provided to vertically stack and load the plurality of user trays 10 for efficient use of a space. Further, each stacker module 500 is provided to horizontally move in the direction of 'Y' in FIG. 1 and opened and closed, and allows the material transport to the outside to be carried out at a position of being taken out. For example, the plurality of user trays 10 may be transferred from an automatic guided vehicle (AGV) to the loading stacker, or the AGV may collect the plurality of user trays 10 from the unloading stacker.

Further, the stacker 2 may be provided to include the loading stacker, the unloading stacker, and the empty stacker, each of which is set in plural, so that internal material transport can be continuously performed even while one of the loading stacker, the unloading stacker and the empty stacker is performing the material transport to the outside.

Below, the structures and operations of the test handler main body 100 will be schematically described with reference to FIGS. 2 and 3.

Figure 2:
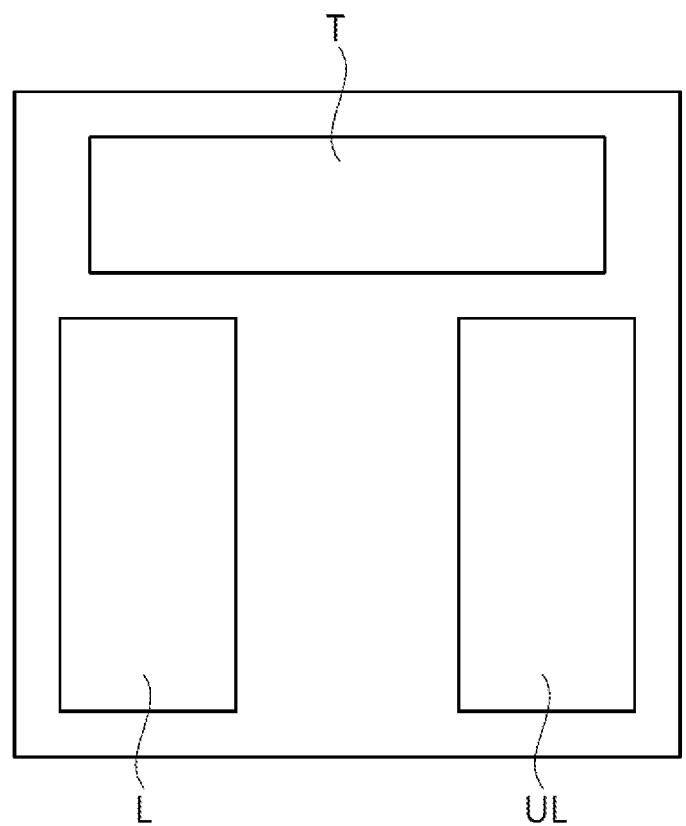
FIG. 2 is a conceptual view of a test handler main body of FIG. 1, which is divided on a plane according to functions.
Figure 3:
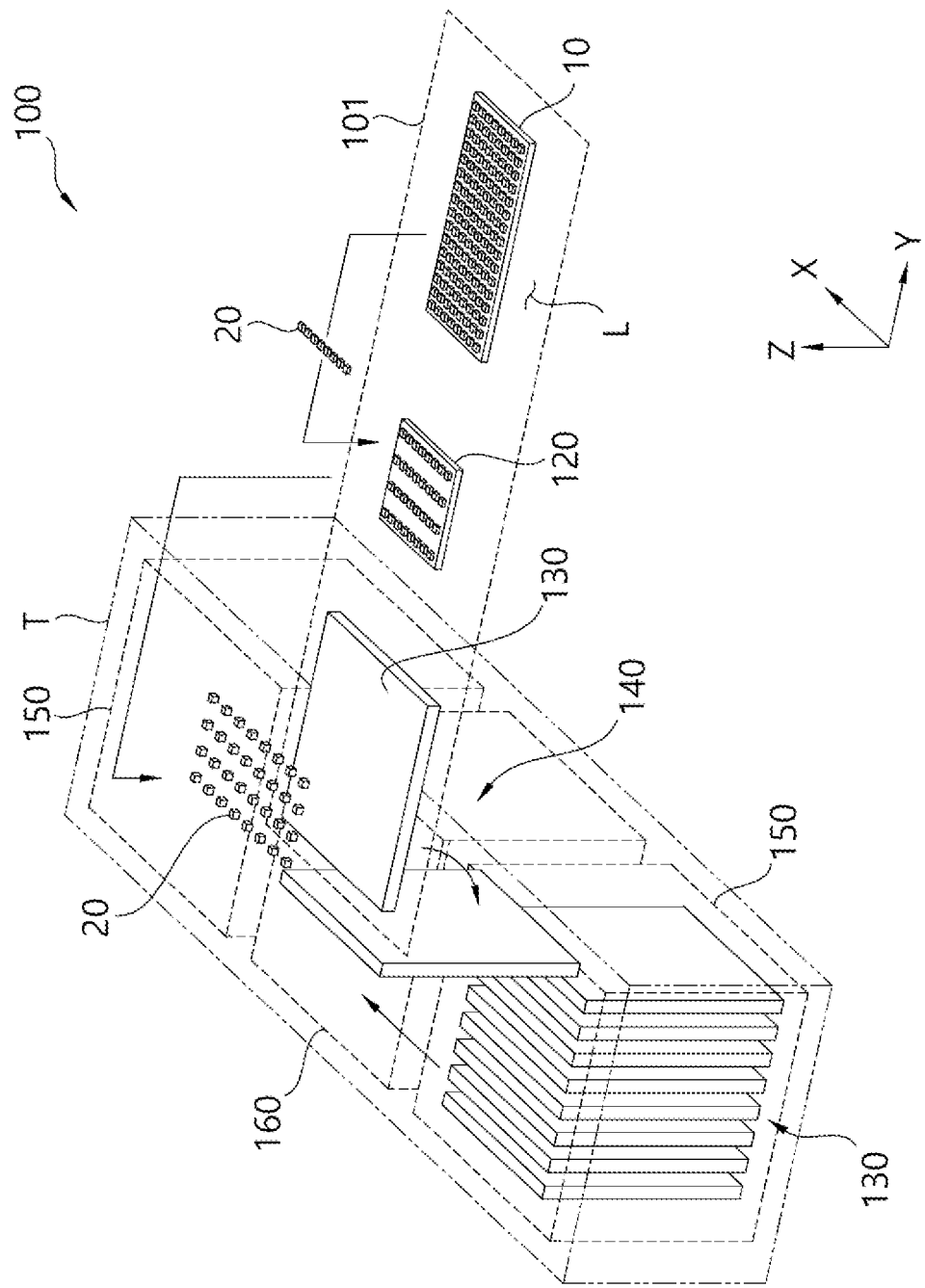
FIG. 3 is a conceptual view of movement of a device and a test tray in the test handler main body.

FIG. 2 is a conceptual view of the test handler main body 100 of FIG. 1, which is divided on a plane according to functions, and FIG. 3 is a conceptual view of movement of the device 20 and the test tray 130 in the test handler main body 100.

In the test handler main body 100, the plurality of devices 20 are subjected to a test, and the devices 20 are sorted after the test, the device 20 may be transferred and loaded before and after the test. The test handler main body 100 may be functionally divided into a loading site L, a test site T, and an unloading site UL.

The loading site L is provided to pick up the plurality of devices 20 from the user tray 10 and place the devices 20 in a test tray 130. The loading site L may include a hand 110 and a loading shuttle 120 to transfer the device 20 from the user tray 10 to the test tray 130, and a scanner (not shown) to perform the test.

At a pick-up position, the user trays 10 loaded into the loading stacker may be alternately supplied one by one, and the hand 110 (to be described later) picks out and transfers only the plurality of devices 20 from the user tray 10. After all the loaded devices 20 are transferred, the empty user tray 10 is replaced by the user tray 10 loaded with the devices 20 to thereby continuously supply the device 20. Meanwhile, at the pick-up position, the plurality of user trays 10 may be exposed to continuously supply the devices 20 even when the user trays 10 loaded into one stacker module 500 are used up or go wrong. In this case, while the devices 20 are being transferred from one user tray 10, another user tray 10 may be on standby or replaced by a new user tray 10.

The hand 110 is provided to pick up and transfer the plurality of devices 20 and then load the plurality of devices 20 into the test tray 130 or the loading shuttle 120. The hand 110 may be provided in plural and be in charge of the material transport in every transfer section. The hand 110 may be installed on an upper rail so as to move in a horizontal direction, and may include an attachment which faces downward and a linear actuator (not shown) by which length adjustment is possible in a vertical direction. The attachment may for example include a plurality of vacuum ports to vacuum-adsorb the plurality of devices 20. Further, the attachment may be replaceable according to the kinds, sizes and shapes of the device 20.

Meanwhile, the test tray 130 includes an insert in every loading groove in consideration of thermal deformation or the like of the device 20 while the device 20 is held and subjected to the test, and a space between the loading grooves of the test tray 130 may be different from that of the user tray 10. In general, the space between the loading grooves of the test tray 130 is greater than that of the user tray 10. Therefore, the plurality of devices 20 are picked up from the user tray 10 at the pick-up position by the hand 110, and then loaded into the test tray 130 while widening the space between the devices 20. Specifically, to widen the space in two directions of X and Y, space adjustment may be performed twice. To this end, the loading shuttle 120 is provided between the pick-up position and the test tray 130, the space is adjusted in one direction during transfer from the user tray 10 to the loading shuttle 120, and the space is adjusted in the other direction during transfer from the loading shuttle 120 to the test tray 130.

The loading shuttle 120 is provided between the user tray 10 and the test tray 130, and the loading grooves are arranged with a more widened space therebetween in one direction than that of the user tray 10 so that the plurality of devices 20 can be loaded as primarily arranged. Further, the loading shuttle 120 may be position-controlled in consideration of the positions of the user tray 10, the test tray 130 and the hand 110 for the efficiency of the material transport.

The scanner (not shown) is provided to identify a barcode when the device 20 to be transferred has the barcode. The scanner (not shown) may be provided to scan the barcode on a path where the hand 110 picks up and transfers the device 20. The scanner may be provided at various positions so as to easily scan the barcode according to the shapes, sizes and kinds of the device 20.

At a placing position, the empty test tray 130 is supplied and the device 20 is transferred and loaded. When the devices 20 are completely loaded at the placing position, the test tray 130 is then transferred to the test site T, so as to receive a new empty test tray 130.

Meanwhile, an insert opening unit is provided at the placing position. The insert opening unit may include a mask and a preciser to selectively open the insert provided in the test tray. The test tray 130 includes the inserts in the respective loading grooves, and each insert includes a locking portion to prevent the device 20 from separation. A reference position of each locking portion is set as a position for preventing the device 20 from separation, and the mask presses the locking portion to be switched over to an opened position.

The loading of the device 20 into the test tray 130 is achieved by expanding the locking portion of the insert to the mask in the state that the insert is pressed by the preciser, and transferring the device 20 to the loading groove by the hand 110.

The mask is shaped corresponding to the test tray 130, and includes a plurality of projections 312 to respectively expand the locking portions of the inserts when being in close contact with the test tray 130.

The preciser is as described above provided to temporarily hold the inserts provided in the test tray 130 and having a little gap. The preciser includes a plurality of pressure pins respectively corresponding to the positions of the inserts, and temporarily holds the test tray 130 as the preciser is in close contact with the test tray 130 and presses the inserts. Therefore, it is possible to minimize a position error when the device 20 is settled on the insert.

However, although it is not shown, an elevator for moving the mask and the preciser up and down independently of each other may be additionally provided.

The test site T is provided to make the plurality of devices 20 loaded into the test tray 130 be tested in units of the test tray 130, and transmit a test result. In a test chamber 160, a thermal load test may for example be performed to test the functions of the devices 20 within a temperature of −40° C. to 130° C.

The test site T may include the test chamber 160 and buffer chambers 150 provided before and after the test chamber 160. The buffer chamber 150 is provided to be loaded with the plurality of test trays 130, and provided so that pre-heating or post-heating treatment can be performed before and after performing the thermal load test.

In the test site T, the test tray 130 can be transferred and tested as being kept upright, thereby reducing the overall size of the test handler. Although it is not illustrated in detail, a position switching unit 140 may be provided before and after the buffer chamber 150 and switch the position of the test tray 130 over to an upright position.

The unloading site UL is provided to sort out, transfer and load the devices 20 of the test tray 130 transferred from the test site T according to the test results. The unloading site UL may include elements similar to those of the loading site L, and transfer the device 20 in reverse order from that of the loading site L. However, the unloading site UL may include a plurality of sorting shuttles 170 to temporarily collect the devices 20 according to the grades from the test tray 130. To improve the efficiency of the material transport, when a predetermined number of devices 20 having the same grade are loaded into the sorting shuttle 170, a plurality of devices 20 may be picked up and transferred to the user tray 10 at the same time.

Meanwhile, although it is not shown, the empty test tray 130, of which the transfer of the devices 20 is finished in the unloading site UL, may be circulated as transferred toward the loading site L.

Further, although it is not shown, a controller may be additionally provided to control the activation of the foregoing elements.

Below, the stacker according to the disclosure will be described in detail with reference to FIG. 4.

Figure 4:
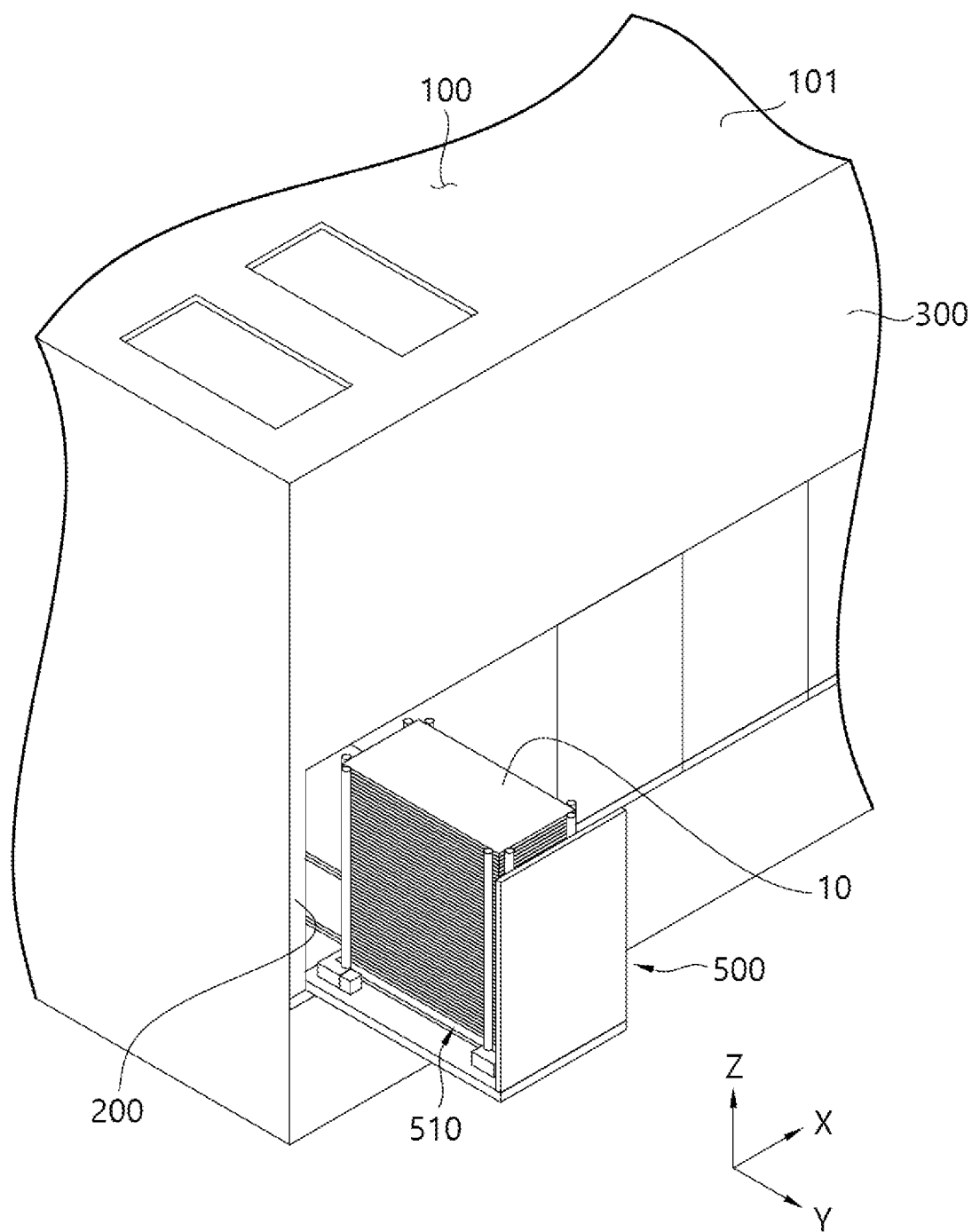
FIG. 4 is a partial perspective view of a stacker of the electronic device test handler 1 according to the disclosure.

FIG. 4 is a partial perspective view of a stacker of the electronic device test handler 1 according to the disclosure.

As shown therein, the stacker according to the disclosure may be provided to continuously supply or collect the devices 20 under a base 101 of the test handler main body 100. The stacker may include the stacker module 500.

The stacker module 500 is provided in plural, and the stacker modules 500 are opened and closed independently of each other to exchange the user tray 10 with the outside. The stacker module 500 may be provided to be opened moving in the horizontal direction. The stacker module 500 may include a frame 200, a loading portion 510, a slider 530, a linear actuator 550, a guide 610, a sensor 620 and a door 540.

The frame 200 may be structured to form an overall framework.

The loading portion 510 refers to a space where the plurality of user trays 10 are stacked and loaded. The loading portion 510 may be loaded with the user trays 10 as much as '1 lot' by which the user trays 10 are exchanged with an external means for transferring the user tray 10, for example, a robot. However, the number of user trays 10 corresponding to '1 lot' may be variously varied depending on the kinds of the device 20, and thus detailed descriptions about an exemplary example thereof will be omitted. The space of the loading portion 510 may be formed corresponding to the shape and size of the user tray 10.

The slider 530 may be provided at the lower side of the stacker module 500 so that the stacker module 500 can slide and move relative to the frame 200. The slider 530 may be provided in plural to stably support the stacker module 500, and restrict the stacker module 500 to move to a given reciprocating position.

The linear actuator 550 is provided to move the stacker module 500 in the horizontal direction. The linear actuator 550 includes a first side connected to the frame 200 and a second side connected to a first side of the stacker module 500 and is provided to open and close the stacker module 500 in response to an input. This embodiment shows the linear actuator 550 by way of example, but various alternative elements may be applied for the reciprocation of the stacker module 500.

The guide 610 is provided to prevent the user tray 10 from being separated from the loading portion 510 in the state that the plurality of user trays 10 are stacked. The guide 610 is formed as vertically extended from a plurality of points along the circumference of the loading portion 510. For example, two adjacent guides 610 may be provided in the edges of the user tray 10, and a total of eight guides 610 may be provided.

The sensor 620 may be provided to identify the presence and the loading completion of the user tray 10 in the loading portion 510. The sensor 620 may be provided to identify the presence of the user trays 10 positioned at the uppermost and lowermost sides when the user trays 10 are loaded into the loading portion 510. When the uppermost sensor senses the presence of the user tray 10, it is identified that the user tray 10 is completely loaded into the loading portion 510, and a corresponding subsequent operation is controlled. On the other hand, when the lowermost sensor senses the absence of the user tray 10, it is identified that the loading portion 510 is empty, and a corresponding subsequent operation is controlled. Meanwhile, when the user trays 10 from the outside are loaded in units of '1 lot' and the lowermost sensor detects the user tray 10, it is identified that the loading portion 510 is full of the user tray 10. On the other hand, when the user tray 10 is not detected, it is identified that the loading portion 510 is used up and empty. Meanwhile, the foregoing sensor 620 may employ variously sensors, such as a laser sensor, an infrared sensor, an ultrasonic sensor, etc. as long as it can identify the presence of the user trays 10 at spaced points.

The door 540 is provided to shield the stacker module 500 from the outside when the stacker module 500 moves to and is completely inserted in the stacker.

A transfer 410 is provided to grip the user tray 10 inside the stacker 300. The transfer 410 is provided in plural, and there are one or more transfers 410 involved in loading, and one or more transfers 410 involved in unloading. The transfer 410 may include a plurality of actuators (not shown) for horizontal movement and vertical movement. The transfer 410 may be controlled to transfer the user tray 10 between one of the loading portions 510 and one of set plates 320. Further, the transfer 410 may be controlled to perform material transport of the user tray 10 between the loading portion 510. The transfer 410 may be controlled to withdraw the user trays 10 one by one from the upper side of the loading portion 510, or, reversely, stack and load the user trays 10 one by one into the lower side.

The set plate 320 is provided to expose the received user tray 10 to the test handler main body 100. The set plate 320 is provided to move up and down with the loaded user trays 10. When moving up, the set plate 320 is moved to a position where the hand 110 of the test handler main body 100 can pick up the device 20. When moving down, the set plate 320 is moved to a position where the transfer 410 can replace the user tray 10. There may be a plurality of set plates 320 between the loading site L and the unloading site UL.

Below, hand teaching according to the disclosure will be described in detail with reference to FIGS. 5 to 11.

Figure 5:
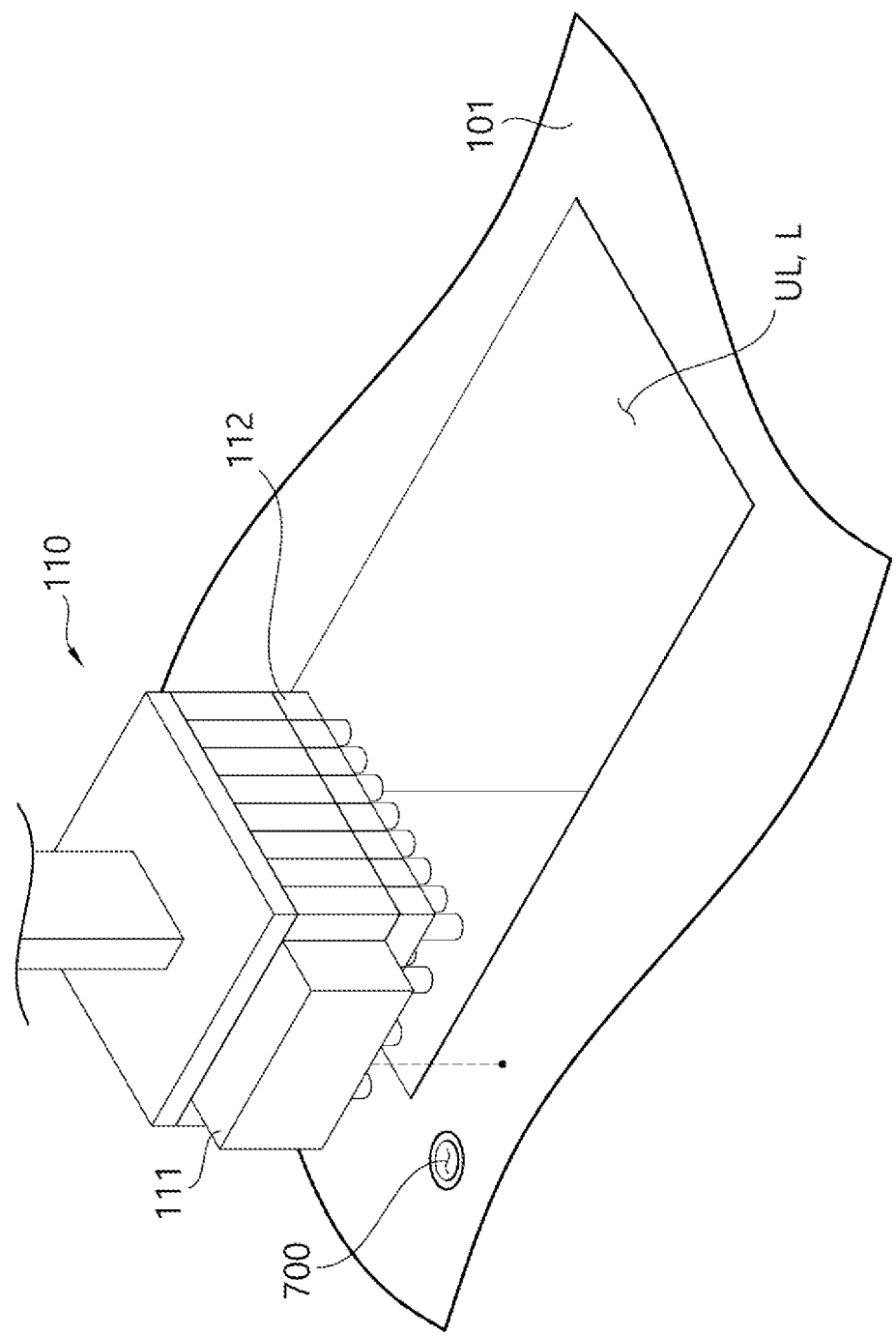
FIG. 5 is a partial perspective view illustrating both the hand and the base.
Figure 6:
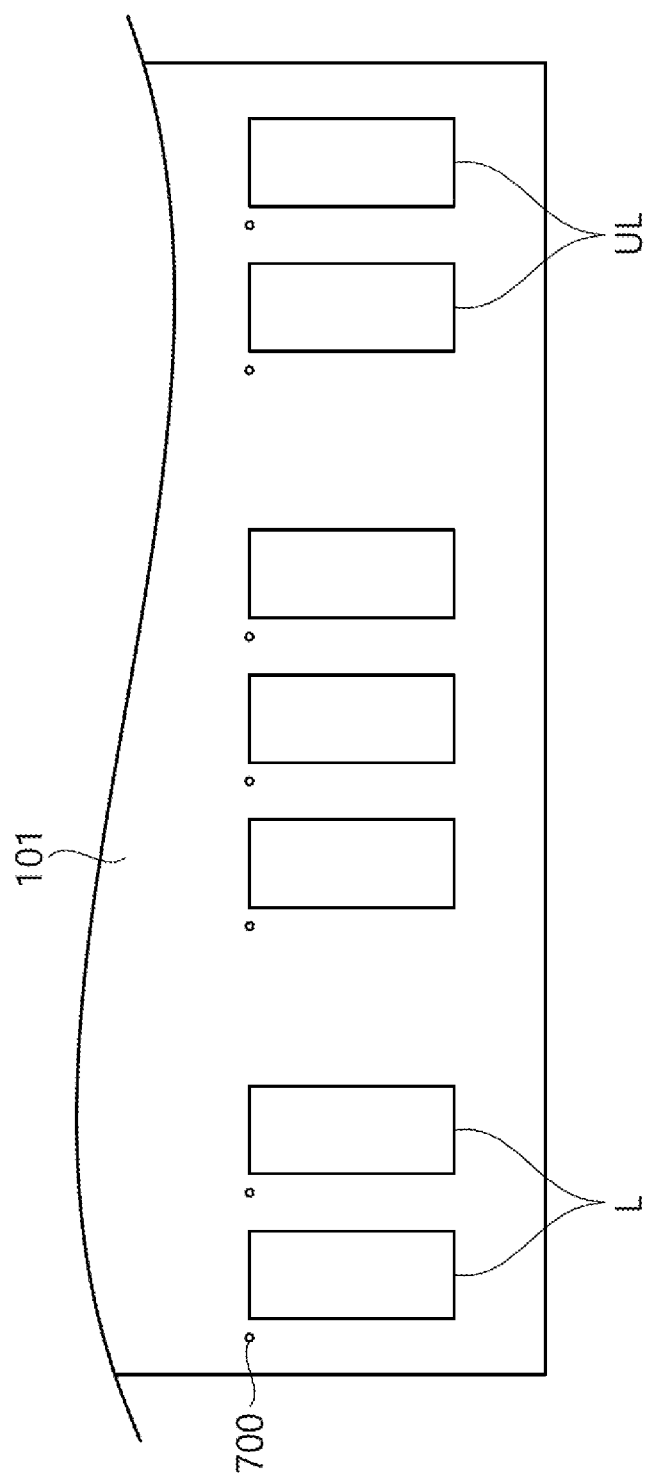
FIG. 6 is a plan view partially illustrating a base.

FIG. 5 is a partial perspective view showing both the hand 110 and the base, and FIG. 6 is a plan view partially showing the base.

As shown therein, the test handler according to the disclosure may be provided with a plurality of pick-up sites L or a plurality of placing sites UL on a base 101, and may include a plurality of reference grooves 700 adjacent to the sites. Here, the pick-up or placing site refers to a site on which the user tray 10 moves up from below the base 101 and positioned as described above, and the hand 110 picks up and transfer a device 20 from the user tray 10 or transfers the tested device 20 to the empty user tray 10. For example, the hand 110 may be controlled to shuttle between a certain point and a shuttle or the test tray 130 on the site during the reciprocation.

The reference grooves 700 may be provided at a position adjacent to each site. The reference groove 700 may be formed on the base 101 and recessed to have a predetermined depth and a predetermined inner diameter. The reference groove 700 is formed at a predetermined position from the site, and mechanically set to have relative coordinates permanently fixed from the site. Therefore, the hand 110 first figures out the position of the reference groove 700, and reflects a position difference previously identified from the reference groove 700 to the site, thereby accurately correcting the position of the site. The difference in the relative coordinates from the reference groove 700 to the site may be a distance in previously identified X and Y directions. Meanwhile, the coordinates of the site may point at the center of the site, or the coordinates of the edge of the site adjacent to the reference groove 700 or the coordinates of the edge of the user tray arranged on the site.

Meanwhile, it is illustrated by way of example that the reference groove 700 is formed as a circular shape at a predetermined depth from the surface of the base, but this is merely an example. The reference groove 700 may be formed to have various cross-section shapes. Further, as described above, the reference groove 700 may be formed as a groove recessed from the top surface of the base, or may alternatively be formed as a projection protruding upward from the top surface of the base.

The hand 110 includes a kit 112 at one side thereof to pick up or place the device while adjusting its height in up and down directions. The kit 112 may be formed according to the kinds and sizes of devices. For example, in case of a semiconductor chip, the kit 112 may be formed to vacuum-adsorb and hold the top surface of the semiconductor chip.

The hand 110 includes a sensor 111 at one side thereof to detect the reference groove 700 in a downward direction. The sensor 111 is provided as a contactless sensor. For example, the sensor 111 may be provided as a laser displacement sensor 111. Because the sensor 111 has a contactless structure and is thus free from abrasion or the like due to contact, it is possible to maintain accuracy even though the sensor 111 is repetitively used. Further, the contactless sensor makes it possible to quickly calculate a reference point P0. Although it will be described below that the laser displacement sensor 111 is used to calculate the reference point P0, this description is merely an example. Alternatively, a contactless vision camera may be used in performing alignment.

Although it is not shown, a controller (not shown) may be provided to control the operations of the hand 110, and reset the reference point P0 of the hand 110 based on a signal received from the sensor 111. Meanwhile, description about the features of the controller will be omitted because the controller has widely been used.

Below, a hand teaching process will be described in detail with reference to FIGS. 7 to 9.

Figure 7:
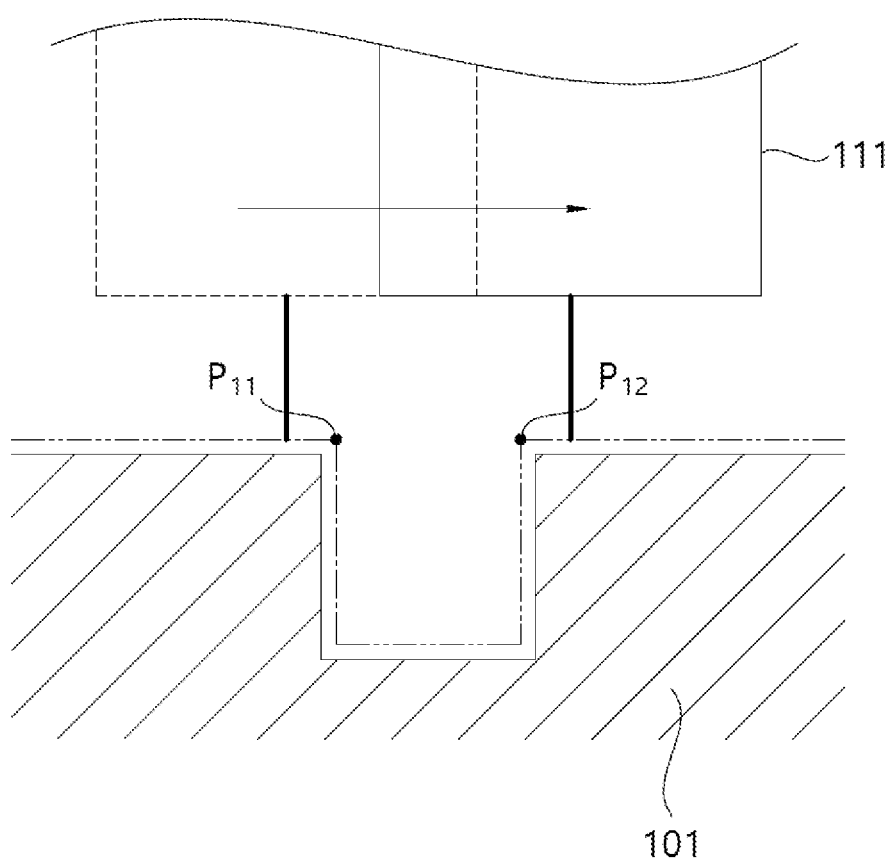
FIG. 7 shows a conceptual view of when a hand detects a reference groove.

FIG. 7 shows concept of when the hand 110 detects the reference groove 700. As shown therein, the sensor 111 provided in the hand 110 is configured to measure a distance between the end thereof and an object in a straight direction while facing downward. In a downward direction, the reference groove 700 is formed as cut from the top surface of the base. The position of the hand 110 on a plane may be controlled so that the sensor 111 can measure the distance while crossing the reference groove 700. Mostly, a position error is within the inner diameter of the reference groove 700, and therefore the position error of the hand 110 is less likely to go beyond the inner diameter due to the repetitive use or the replacement of the kit 112. Therefore, it is possible to perform the measurement without missing the reference groove 700 even though a user makes an operation for detecting the reference groove 700 at the previously stored position of the reference point P0 without separately detecting the coordinates in order to measure the position of the reference point P0.

The sensor 111 detects the bottom surface of the reference groove 700 cut from the reference height of the base as a height difference when scanning the upper exterior of the reference groove 700. In this case, the sensor 111 moves a distance longer than the inner diameter of the reference groove 700, thereby detecting the boundary coordinates of the reference groove 700. In the sensor 111, the height difference between the reference groove 700 and the base may be measured as an on/off signal, and thus the controller stores the position data about the corresponding hand 110 along with the on/off signal. In particular, when the measurement is carried out while passing the reference groove 700, a pair of boundary coordinates P11 and P12 is measured, and it is thus possible to calculate the coordinates of the reference point P0. However, in an exceptional case where the position error goes beyond the reference inner diameter, single boundary coordinate or no boundary coordinates may be measured even though the depth measurement is performed by moving to the previous reference point P0. In such a case, the position of the hand 110 may be adjusted to obtain two boundary coordinates while changing the measurement positions.

Below, concept of calculating the reference point P0 will be described in detail with reference to FIGS. 8 and 9.

Figure 8:
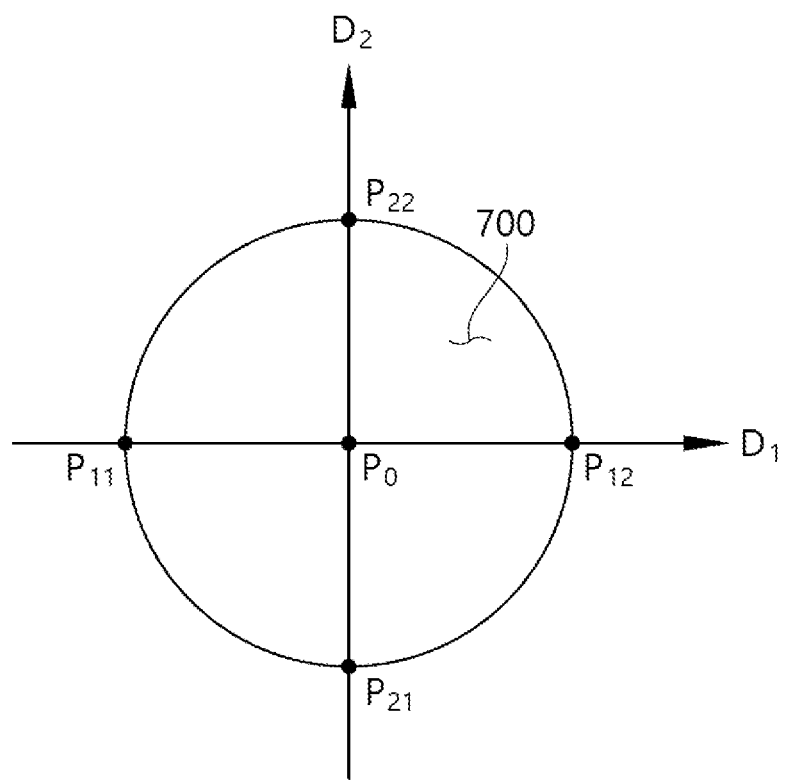
FIGS. 8 and 9 are conceptual views of calculating a reference point.
Figure 9:
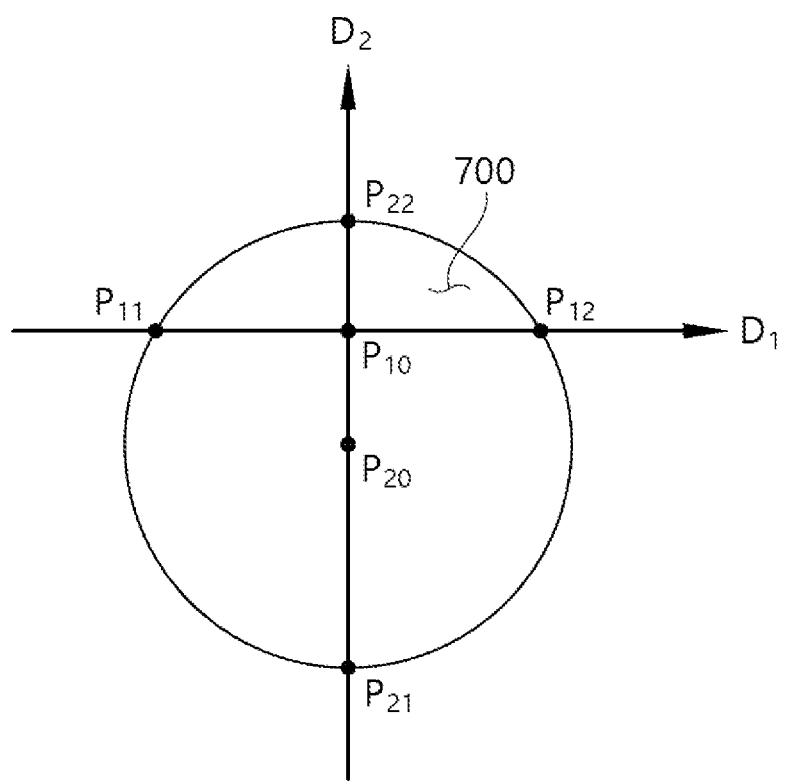

FIGS. 8 and 9 show concept of calculating the reference point. As shown therein, the controller moves the hand 110 to cross the reference groove 700 above the reference groove 700 in a first direction D1 during the measurement. For example, the first direction D1 may be oriented in the direction of 'X' on the base. When the measurement is performed along the movement in the direction of 'X', a pair of boundary coordinates is obtained due to the height difference between the reference groove 700 and the top surface of the base 101. After obtaining the pair of boundary coordinates P11 and P12 in the first direction D1, intermediate coordinates P10 between these two points is calculated. The intermediate coordinates P10 in the first direction is derived based on simple arithmetic calculation. Here, the first direction D1 may pass the center of the reference groove 700 when the reference groove 700 has a circular shape (see FIG. 8), or may not pass the center (see FIG. 9). Therefore, the maximum measured distance between the pair of boundary coordinates P11 and P12 is the same as the diameter of the reference groove 700, but the position error mostly occurs when the measured distance is smaller than the diameter of the reference groove 700.

Then, the controller moves the hand 110 in a direction orthogonal to the first direction D1, and specifically moves the hand 110 in the direction of 'Y' at the point where the position of the sensor 111 passes the previously-obtained intermediate coordinates P10 in the first direction, thereby detecting the reference groove 700. In the second direction D2, a pair of second-direction boundary coordinates P21 and P22 is also obtained at the boundary points of the reference groove 700 like that in the first direction D1. In other words, the same calculation as that of the first-directional intermediate coordinates P10 may be carried out for the second-directional intermediate coordinates P20. Here, when the sensor 111 moves in the second direction D2, the sensor 111 geometrically passes the center of the reference groove 700. Therefore, the intermediate coordinates in the second direction D2 calculated from the pair of boundary coordinates P21 and P22 in the second direction D2 ultimately become the center of the reference groove 700. Therefore, the hand 110 can calculate the center coordinates of the reference groove 700, and the horizontal position of the hand 110 can be corrected based on the coordinates of the newly calculated reference point P0.

First, when the position of the reference point P0 is renewed, it is possible to control the position of the hand 110 based on the previously stored position without separate teaching because vertical and horizontal distances from the reference point P0 to the site are mechanically set.

Below, a method of teaching the hand 110 in the test handler according to another embodiment of the disclosure will be described in detail with reference to FIGS. 10 and 11.

Figure 10:
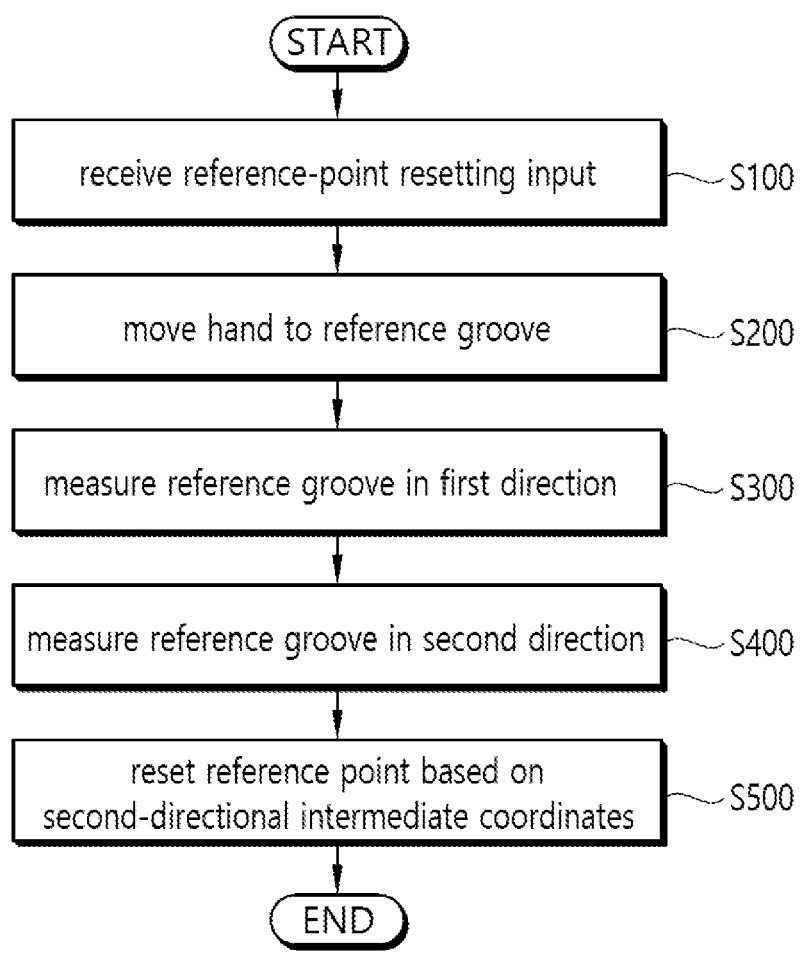
FIG. 10 is a flowchart of a hand teaching method according to another embodiment of the disclosure.
Figure 11:
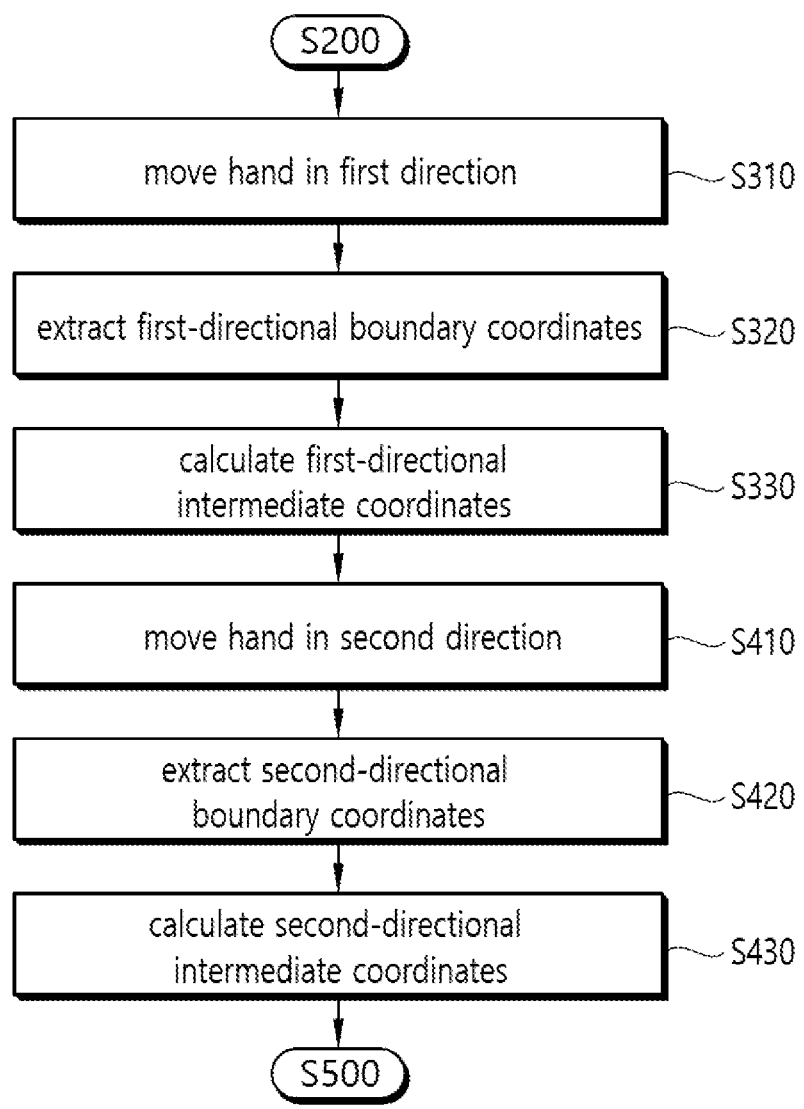
FIG. 11 is a flowchart showing detailed operations of FIG. 10.

FIG. 10 is a flowchart of a hand teaching method according to another embodiment of the disclosure, and FIG. 11 is a flowchart showing detailed operations of FIG. 10.

As shown therein, the hand teaching method of the test handler according to the disclosure may include operations of receiving a reference-point resetting signal (S100), moving the hand to above the reference groove (S200), measuring the reference groove in the first direction (S300), measuring the reference groove in the second direction (S400), and resetting the reference point (S500).

The hand teaching method of the test handler according to the disclosure may start when the reference-point resetting signal is received (S100). In the operation S100 of receiving the reference-point resetting signal, a start signal may be generated to correct a horizontal position error when the horizontal position error occurs in the hand. The horizontal position error of the hand may be caused by various factors such as an external factor, a position error due to repetitive use, abrasion of actuating elements, replacement by a different kind of kit 112 for picking up the device, etc. When the position error occurs, the device may not be picked up, or may be loaded into a socket as occasionally misaligned during placement. Accordingly, a user can be informed whether the position error occurs or not.

A user who recognized whether the position error occurs or not may determine whether to reset the reference point P0 and make an input. There may be a plurality of sites and a plurality of hands, and therefore the site and the hand to be subjected to resetting of the reference point P0 may be selected by a user's input. Meanwhile, when the kit 112 is replaced, a process of correcting the position error may be automatically performed at the first test running after the replacement of the kit. In this case, the hand for performing the position error may be previously selected, or the hand needed to be corrected based on a present position error may be automatically selected.

In the operation of moving the hand to above the reference point (S200), the controller moves the hand to above the reference groove 700 adjacent to the site based on a resetting input for the reference point P0. Specifically, the sensor 111 of the hand gets ready to measure the reference groove 700 while facing downward. Here, the sensor 111 may be provided as a contactless sensor, so that the reference groove 700 can be measured without direct contact between the hand and the reference groove 700.

The operation S300 of measuring the reference groove in the first direction refers to an operation of moving the hand so that the sensor 111 can measure the reference groove 700. The operation S300 of measuring the reference groove in the first direction D1 may include operations of moving the hand in the first direction D1 (S310), extracting the first-directional boundary coordinates (S320), and calculating the first-directional intermediate coordinates (S330).

The operation S310 of moving the hand in the first direction refers to an operation in which the controller controls the horizontal position of the hand to thereby control the position so that the hand above the reference groove 700 in a certain direction can straightly moves, passes and measures the reference groove 700.

The operation S320 of extracting the first-directional boundary coordinates refers to an operation of calculating the coordinates of the boundaries corresponding to the height difference based on values measured by the sensor 111. The pair of first-directional boundary coordinates P11 and P12 may be calculated when the sensor 111 passes the reference groove 700.

The operation S330 of calculating the first-directional intermediate coordinates refers to an operation of calculating and extracting the coordinates P10 at the intermediate point between the pair of boundary coordinates calculated in the previous operation S320.

The operation S400 of measuring the reference groove in the second direction refers to an operation of passing and measuring the reference groove 700 in the second direction, which is orthogonal to the first direction D1, among horizontal directions. The operation S400 of measuring the reference groove in the second direction may include operations of moving the hand in the second direction D2 (S410), extracting the second-directional boundary coordinates (S420), and calculating the second-directional intermediate coordinates (S430).

In the operation 410 of moving the hand in the second direction, the second direction D2 refers to a moving direction of passing the foregoing first-directional intermediate coordinates P10. The operation S420 of calculating the second-directional boundary coordinates, and the operation S430 of calculating the second-directional intermediate coordinates P20 are performed like those in the first direction D1 by just switching the first direction D1 over to the second direction D2.

The operation S500 of resetting the second-directional intermediate coordinates as the reference point refers to an operation of resetting the intermediate coordinates P20 in the second direction D2 as the reference point P0 because the intermediate coordinates P20 in the second direction D2 ultimately become the center coordinates of the reference groove 700. When the reference point P0 is renewed, the position on the plane of the hand may be controlled based on the new reference point P0.

As described above, there are provided an electronic device test handler having a hand teaching function according to the disclosure and a hand teaching method using the same, in which the position error caused by an error due to repetitive use or replacement of the kit 112 is automatically corrected based on the reference groove 700, and thus there are no needs of separate work for the position correction, thereby having effects on improving convenience and efficiency.

The invention claimed is:

1. A test handler with a hand teaching function, the test handler comprising:
   a plurality of sites in which a device is picked up or placed;
   a reference point provided adjacent to each of the plurality of sites; and
   a hand provided to transfer the device and comprising a contactless sensor to calculate a position of the reference point and
   a controller to control the hand,
   wherein the reference point comprises coordinates within a reference groove formed to have a predetermined depth and a predetermined inner diameter on a base,
   wherein the sensor comprises a laser displacement sensor to measure a height of a top surface of the base,
   wherein the controller is configured to extract a pair of boundary coordinates by straightly moving the sensor to above the reference groove when the reference point is calculated, and calculates intermediate coordinates based on the pair of boundary coordinates, and
   wherein the controller is configured to calculate a center of the reference groove as the reference point based on a reference-position resetting input.

2. The test handler with the hand teaching function of claim 1, wherein the controller controls:

the calculation for extracting the intermediate coordinates to be performed in a first direction and a second direction orthogonal to the first direction, and straight movement to be performed in a direction passing the intermediate coordinates in the first direction when the intermediate coordinates in the second direction are calculated.

3. The test handler with the hand teaching function of claim 2, wherein the controller resets the intermediate coordinates in the second direction as the reference point.

4. A hand teaching method of a test handler, comprising:
receiving a signal for resetting a reference point when a hand of the test handler is activated;
moving the hand to above one among reference grooves adjacent to a site where the hand is picked up and placed;
calculating a position of the reference point by a contactless sensor provided in the hand; and
resetting a position of the site based on the position of the reference point.

5. The hand teaching method of the test handler of claim 4, wherein the calculating the position of the reference point comprises calculating the position of the reference groove formed with a predetermined depth and a predetermined diameter on a base.

6. The hand teaching method of the test handler of claim 5, wherein the calculating the position of the reference point comprises calculating a position of a center of the reference groove.

7. The hand teaching method of the test handler of claim 6, wherein the sensor comprises a laser displacement sensor to distinguish between the base of the test handler and the reference groove based on a height difference.

8. The hand teaching method of the test handler of claim 7, wherein the calculating the position of the reference groove comprises:
controlling a position of the hand so that the laser displacement sensor can cross the reference groove in a certain direction above the reference groove; and
extracting boundary coordinates of a pair of reference grooves by the laser displacement sensor, and calculating intermediate coordinates based on the boundary coordinates of the pair of reference grooves.

9. The hand teaching method of the test handler of claim 8, wherein the calculating the position of the reference groove comprising:
calculating first-directional intermediate coordinates while the laser displacement sensor crosses the reference groove in a first direction; and
calculating second-directional intermediate coordinates while the laser displacement sensor moves in a second direction orthogonal to the first direction and passing the first-directional intermediate coordinates.

10. The hand teaching method of the test handler of claim 9, wherein the second-directional intermediate coordinates are reset based on the position of the center of the reference groove.

* * * * *